United States Patent
Kraus et al.

(10) Patent No.: US 11,965,264 B2
(45) Date of Patent: Apr. 23, 2024

(54) ELECTRODE FOR DEPOSITING POLYCRYSTALLINE SILICON

(71) Applicant: WACKER CHEMIE AG, Munich (DE)

(72) Inventors: Heinz Kraus, Zeilarn (DE); Piotr Filar, Marktl (DE)

(73) Assignee: Wacker Chemie AG, Munich (DE)

( * ) Notice: Subject to any disclaimer, the term of this patent is extended or adjusted under 35 U.S.C. 154(b) by 587 days.

(21) Appl. No.: 17/263,631

(22) PCT Filed: Jul. 27, 2018

(86) PCT No.: PCT/EP2018/070466
§ 371 (c)(1),
(2) Date: Jan. 27, 2021

(87) PCT Pub. No.: WO2020/020468
PCT Pub. Date: Jan. 30, 2020

(65) Prior Publication Data
US 2021/0164124 A1    Jun. 3, 2021

(51) Int. Cl.
| | |
|---|---|
| *C25D 17/10* | (2006.01) |
| *C01B 33/035* | (2006.01) |
| *C25D 13/12* | (2006.01) |
| *C30B 28/14* | (2006.01) |
| *C30B 29/06* | (2006.01) |
| *C30B 29/60* | (2006.01) |

(52) U.S. Cl.
CPC ............ *C25D 17/10* (2013.01); *C01B 33/035* (2013.01); *C25D 13/12* (2013.01); *C30B 28/14* (2013.01); *C30B 29/06* (2013.01); *C30B 29/60* (2013.01)

(58) Field of Classification Search
None
See application file for complete search history.

(56) References Cited

U.S. PATENT DOCUMENTS

| | | | |
|---|---|---|---|
| 6,639,192 B2 | 10/2003 | Hertlein et al. | |
| 8,329,132 B2 | 12/2012 | Endoh et al. | |
| 8,366,892 B2 | 2/2013 | Kraus et al. | |
| 9,150,420 B2 | 10/2015 | Kraus | |
| 10,494,714 B2 * | 12/2019 | Qin | ........................ C01B 33/035 |

FOREIGN PATENT DOCUMENTS

| | | | | |
|---|---|---|---|---|
| CN | 204938991 U | | 1/2016 | |
| DE | 20132014065 | * | 9/2013 | ........... C01B 33/035 |
| DE | 202013104065 U1 | | 11/2013 | |
| WO | 2010133386 A1 | | 11/2010 | |
| WO | WO 2010133386 | * | 11/2010 | ........... C01B 33/035 |
| WO | 2016073014 A1 | | 5/2016 | |

* cited by examiner

Primary Examiner — Tuan N Nguyen
(74) Attorney, Agent, or Firm — Brooks Kushman P.C.

(57) ABSTRACT

Electrode assemblies useful, inter alia, for mounting thin rods in Siemens reactors for manufacture of polysilicon, have a base segment which receives a holder segment, and an insert, interfacial surface(s) of which have depressions and/or elevations which reduce contact surface area, allowing the holder, base segment, insert, and optional intermediate segments to be constructed of materials having different thermal conductivities.

19 Claims, 5 Drawing Sheets

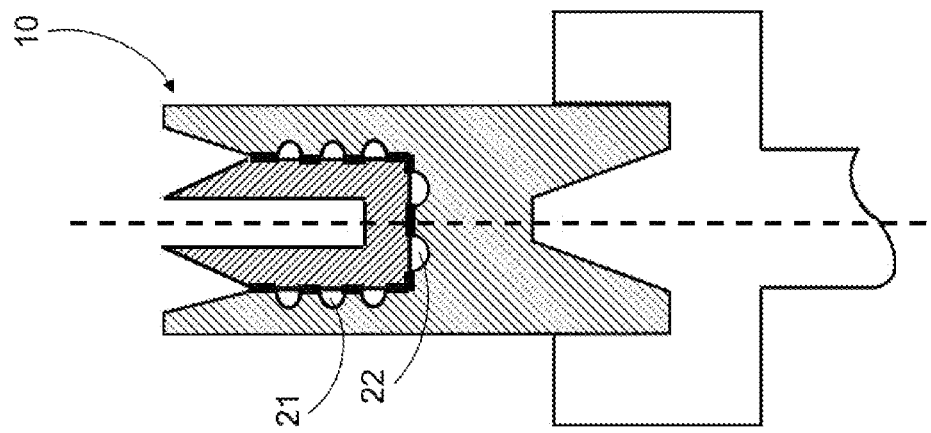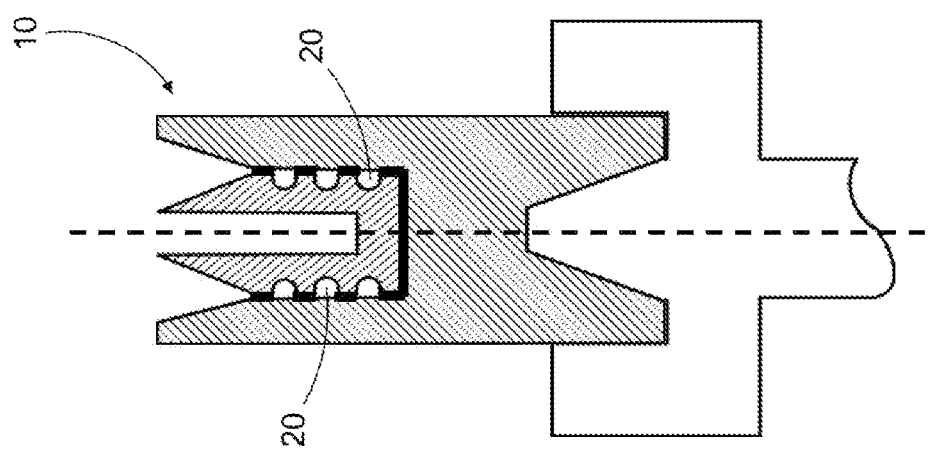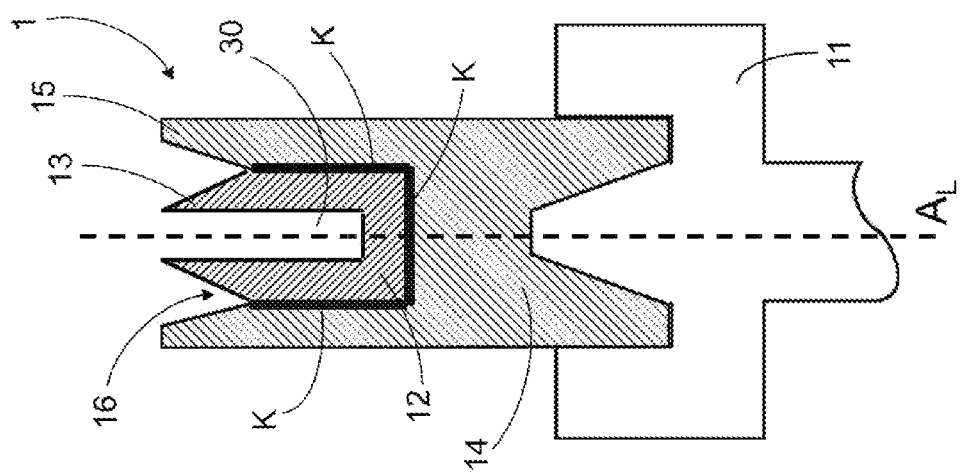

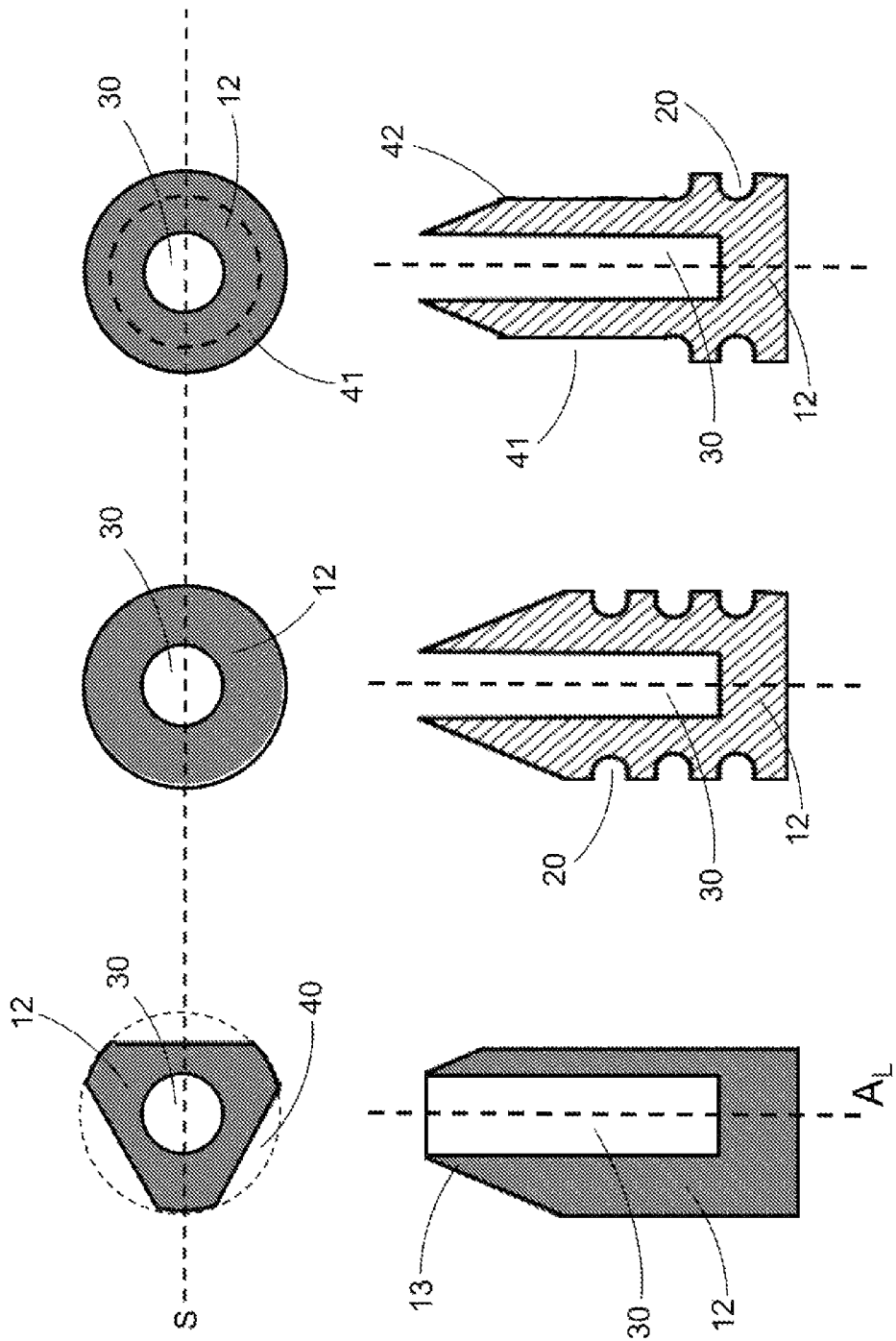

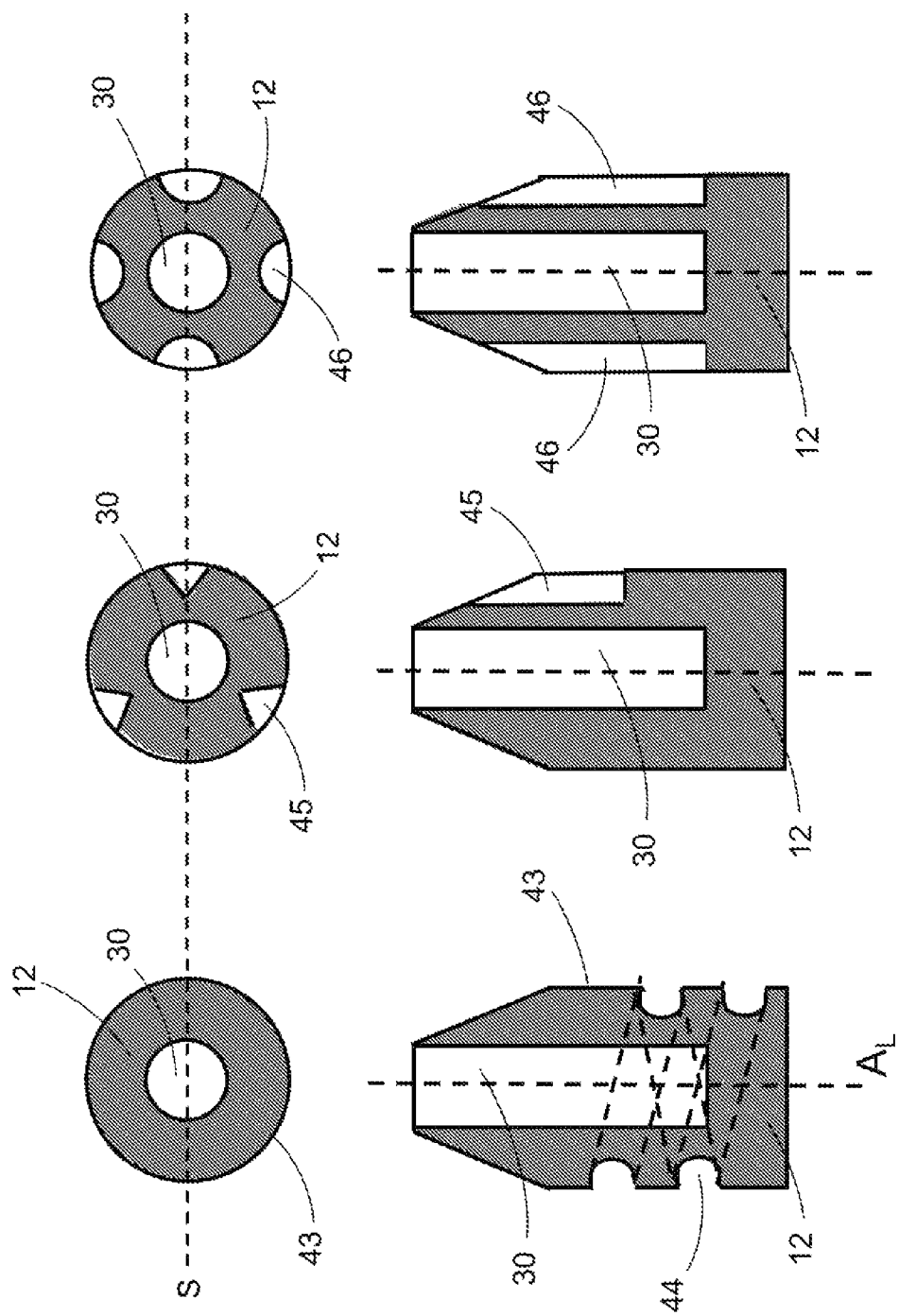

ELECTRODE FOR DEPOSITING POLYCRYSTALLINE SILICON

CROSS REFERENCE TO RELATED APPLICATIONS

This application is the U.S. National Phase of PCT Appln. No. PCT/EP2018/070466 filed Jul. 27, 2018, the disclosure of which is incorporated in its entirety by reference herein.

BACKGROUND OF THE INVENTION

1. Field of the Invention

The invention relates to an electrode having a holder segment, a base segment having a cutout in which the holder segment is accommodated, and optionally at least one intermediate segment arranged between the base segment and the holder segment, wherein adjacent segments have opposing interfaces which are at least partially in mechanical contact with one another and thus form at least one common contact area.

2. Description of the Related Art

Electrodes, in particular graphite electrodes, are an important constituent in industrial processes, for example aluminium and steel production, electrolysis of salt melts, electrolytic decomposition of chemical compounds, thermal deposition reactions and arc welding.

One important application from the field of thermal deposition reactions is the production of polycrystalline silicon (polysilicon) by the Siemens process. This comprises heating filament rods (slim rods) made of silicon in a bell-shaped reactor by direct passage of current and introducing a reaction gas containing a silicon-containing component and hydrogen. The silicon-containing component is usually monosilane or a halosilane of general composition $SiH_nX_{4-n}$ (n=0, 1, 2, 3; X=Cl, Br, I). It is typically a chlorosilane or chlorosilane mixture, usually trichlorosilane. The construction of a typical Siemens reactor is described in US 2009/0136408 A1 for example.

The reactor floor is generally provided with a plurality of electrode holders, wherein the electrode holders penetrate the reactor floor in electrically insulated fashion and project into the reactor with a thickened end, the top of the electrode holder. The feedthrough for the electrode holder is generally sealed with a sealing element. The top of the electrode holder usually has a cutout into which an electrode is positively fitted. The electrode holder is typically made of a material which is electrically conductive, for example of a metal.

The electrode can generally accommodate a filament rod and hold it in position. The electrodes are typically made of high-purity graphite. High-purity graphite has a cold asking residue of <50 ppm. Two filament rods are usually connected by a bridge (made of the same material as the filament rods) to form a pair which forms an electrical circuit via the electrode holders and electrodes (filament rod pair). Electrical energy for heating the filament rods is supplied via the ends of the electrode holders arranged below the reactor floor. The surface temperature of the filament rods is usually more than 1000° C. At these temperatures the silicon-containing component decomposes and elemental silicon is deposited from the gas phase onto the rod surface as polysilicon. This causes the diameter of the slim rods to increase. The electrode is usually at least partially enclosed. After achieving a specified diameter deposition is terminated and the obtained rod pairs are deinstalled. After removal of the bridge approximately cylindrical polysilicon rods are obtained.

The electrodes are thus used as a securing means for the filament rods, for transferring the current flow and the thus-generated heat into the filament/polysilicon rod and in particular as a holder for the growing, ever heavier polysilicon rods. Depending on the target diameter and length of the polysilicon rods to be deposited, rod weights of 50 to 400 kg/rod are achievable. The electrodes moreover dissipate thermal energy from the lower end of the polysilicon rods to the generally cooled electrode holders. The choice of the shape and the material of the electrode is thus of fundamental importance.

It is customary to use graphite as the electrode material since graphite is producible in very high purity and is also chemically inert at temperatures above 1200° C. Graphite moreover has a very low specific electrical resistance in the range between 5 and 50 $\mu\Omega\cdot m$.

A graphite electrode having a conventional shape is described for example in U.S. Pat. No. 6,639,192 B2. It consists of a cylindrical main body having a conical tip. The tip contains a bore for accommodating and contacting a filament rod. The electrode is formed in one piece from graphite and the graphite type employed usually has a high specific thermal conductivity of >145 W/m*K. The disadvantage is that such an electrode exhibits a high heat dissipation at a low rod diameter on account of its cylindrical shape and high specific thermal conductivity.

In order to disfavour the falling over of thin polysilicon rods at the beginning of the deposition an electrode should have a very low heat dissipation. This requires an electrode material having a low specific thermal conductivity and/or an electrode having a small diameter. By contrast, to disfavour the falling over of thick polysilicon rods toward the end of the deposition the electrode should in principle have both a very high thermal conductivity, i.e. be made of a material having a very high specific thermal conductivity, and/or a large diameter. This makes it easier to dissipate the energy required to produce large rod diameters. The electrodes further require mechanical stability, i.e. a minimum diameter dependent on rod weight, to accommodate high rod weights.

Generally, thin rods may be understood as meaning rod diameters of less than 1.5 times, and thick rods as meaning rod diameters of more than 1.5 times, the diameter of a graphite electrode.

The carbon electrode described in U.S. Pat. No. 9,150,420 B2 which comprises not only a conical tip but also an edge which surrounds said tip constitutes an improvement. It has been found that such an electrode exhibits improved heat dissipation and distribution of current density in relation to rod thickness.

However, this electrode also reaches its limits in the face of the demand for ever higher performance deposition processes which are to provide very large rod diameters in combination with the demand for very low, if any, fallover rates.

U.S. Pat. No. 8,366,892 B2 describes a graphite electrode made of two components. Said electrode consists of a base element and an insert, wherein the insert is fitted into the base element and both parts are made of different graphite types. The graphite type of the insert has a lower specific thermal conductivity than the graphite type of the base element. This meets the need for a very low thermal conductivity at the beginning of the deposition and the need for a very high thermal conductivity toward the end of the deposition.

However, the problem is that for graphite the minimum achievable specific thermal conductivity is about 30 W/m*K. An even lower thermal conductivity desirable especially at the beginning of the deposition for further process optimization cannot in principle be realized. The diameter of the electrode could be reduced but this would bring about the problems described above with advancing deposition time.

The invention accordingly has for its object to provide an electrode where the described problems do not occur or are at least markedly reduced.

SUMMARY OF THE INVENTION

These and other objects are achieved by an electrode having a holder segment, a base segment having a cutout in which the holder segment is accommodated and optionally at least one intermediate segment arranged between the base segment and the holder segment, wherein adjacent segments have opposing interfaces which are at least partially in mechanical contact with one another and thus form at least one common contact area. To reduce the contact area, at least one of the interfaces has at least one depression and/or elevation.

BRIEF DESCRIPTION OF THE DRAWINGS

FIG. 1A shows a known electrode,
FIGS. 1B to 1G show inventive electrodes and
FIGS. 2A to 2F show holder segments of inventive electrodes.

DETAILED DESCRIPTION OF THE PREFERRED EMBODIMENTS

Figure 1E:
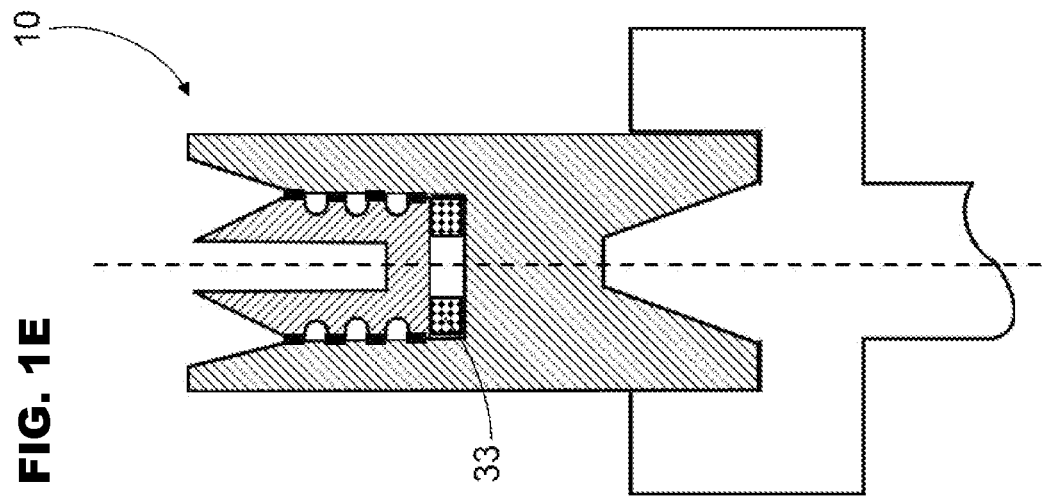

The contact area is thus the mechanical contact area between the segments and ensures both thermal and electrical conductivity.

If the electrode comprises, for example, only a base segment and a holder segment, the contact area is formed from the opposing interfaces of the base segment and the holder segment. The interface of the base segment opposite the holder segment may correspond to the surface of the cutout. If the electrode also comprises an intermediate segment, for example, the contact area is formed both from the opposing interfaces of the base segment and the intermediate segment and from the opposing interfaces of the intermediate segment and the holder segment.

The reduction in the contact area reduces heat dissipation from the holder segment to the base segment. The thermal conductivity of the holder segment may thus in principle be reduced to less than the minimum specific thermal conductivity of graphite (about 30 W/m*K). It was also found that the stability and structural integrity of the electrode is maintained as a result of the depressions/elevations in at least one of the interfaces.

It is preferable when the contact area reduced by the depressions and/or elevations is 10% to 90%, more preferably 30% to 90%, and most preferably 60% to 90%, of the contact area that would result without the presence of the depressions and/or elevations.

It is preferable when the segments are fitted one inside the other and in particular have a coaxial configuration, i.e. have a common rotational axis. However, the geometry of the segments may in principle be chosen as desired, a cylindrical configuration being preferred (irrespective of any depressions and/or elevations). However, the segments need not necessarily all have the same geometry. In respect of possible geometries of the electrode reference may in particular also be made to U.S. Pat. No. 9,150,420 B2.

The cutout for accommodating the holder segment is preferably cylindrical and may be a bore for example. Any intermediate segment preferably likewise has a cutout, preferably a bore, either for accommodating a further intermediate segment or for accommodating the holder segment. The geometries of the cutouts are in principle likewise freely choosable and may differ from one another.

It is preferable when the electrode is a 2-segment electrode made of a base segment and a holder segment or a 3-segment electrode further comprising an intermediate segment.

It is further preferable when at least or exclusively the interface of the holder segment has at least one depression and/or elevation.

The segments are preferably made of carbon, more preferably of graphite, and in particular high-purity or highest-purity graphite. High-purity graphite has a cold ashing residue of <50 ppm. Highest-purity graphite has a cold ashing residue of <10 ppm. The holder segment may also be made of carbon fibre-reinforced carbons (CFC). For reasons of purity highest-purity graphite is preferred.

It is preferable when at least two of the segments differ in respect of their specific thermal conductivity, wherein preferably the holder segment has the lowest and the base segment the highest specific thermal conductivity. The specific thermal conductivity thus preferably increases from the centre of the electrode (holder segment) to its edge (base segment). However, it may also be preferable when the specific thermal conductivity of the base segment and of the holder segment is identical.

The specific thermal conductivity of the holder segment is preferably between 10 and 120 W/m*K, more preferably between 10 and 90 W/m*K, and in particular between 10 and 60 W/m*K.

The specific thermal conductivity of the base segment is preferably between 40 and 200 W/m*K, more preferably between 60 and 120 W/m*K, and in particular between 60 and 100 W/m*K.

The specific thermal conductivity of any intermediate segment is generally between the values specified for the holder segment and the base segment. However, the intermediate segment may also have the same heat capacity as the holder segment or the base segment.

All values for specific thermal conductivities relate to a temperature of 20° C. and are measured according to DIN 51908.

In terms of further properties of the carbon material preferably used for the segments reference may be made to U.S. Pat. No. 9,150,420 B2.

The depressions and/or elevations are preferably punctate and/or linear and may in principle have any desired cross-sections. In the context of the invention it is preferable when exclusively depressions are concerned since these are generally realizable with less cost and complexity.

The cross section of an elevation or depression may be triangular, rectangular, square or semicircular for example. The cross section is in principle immaterial to the performability of the invention, at least when depressions are concerned. Linear depressions or elevations may for example run annularly or helically around the mantle surface of a cylindrical base segment or intermediate segment.

Alternatively or in addition such depressions and/or elevations may be arranged on the base surface. The same applies for example to the mantle surface and the base surface of a cylindrical cutout. Examples of preferred embodiments are in particular also discernible from FIG. 2.

In a preferred embodiment the holder segment has a depression for accommodating a filament rod, in particular of silicon. The electrode is thus particularly suitable for example for processes for depositing polysilicon. As a result of the reduced contact area and the associated reduced heat dissipation from the holder segment to the base segment the electrode is optimally adapted to the small rod diameters occurring at the beginning of the deposition. The risk of fallover of polysilicon rods during the first phase of deposition (until the growing polysilicon also reaches the region of the base segment or optionally the intermediate segment) is thus reduced to a minimum. Fallover of rods generally no longer occurs.

The holder segment may further have a conical or pyramidal tip such as is described in U.S. Pat. No. 9,150,420 B2. The electrode may further be configured such that the base segment and/or any intermediate segment project beyond the flank of the tip and thus form an edge which surrounds the tip such as likewise described in U.S. Pat. No. 9,150,420 B2.

In a further embodiment at least one insert is arranged between the segments. In a 3-segment or 4-segment electrode it is preferable when such an insert is arranged at least or exclusively between the holder segment and the intermediate segment.

The insert makes it possible to reduce the thermal conductivity between adjacent segments even further. The insert preferably does not completely interrupt the contact area, i.e. the mechanical contact, between two segments but rather brings about an additional reduction in the contact area.

The insert may in principle have any desired shape and is preferably arranged at the bottom of a cutout. Said insert may in particular have either the same cross-sectional shape as the cutout in which it is arranged or the cross-sectional shape of the segment that is accommodated in this cutout. A triangular, square or polygonal plate (with or without perforation(s)), a disc (with or without perforation(s)) or a ring may be concerned for example. A plurality of inserts may be arranged one above the other.

It is also possible for a plurality of for example spherical inserts to be concerned. The insert may be pulverulent, for example in the form of quartz sand. Also possible is a network- or scaffold-like configuration. It is further conceivable for the insert to have a shell shape and thus for example partially surround the base segment.

The insert may have a surface having at least one depression and/or elevation. In a preferred embodiment the insert is plate- or disc-shaped and preferably has at least one depression and/or elevation on a top and/or bottom side. In respect of the depression and/or elevation reference may be made to the elucidations given above.

The insert is preferably made of a different material than that of the segments. While the segments are in particular made of graphite, preferred materials for the insert are quartz, silicon carbide, zirconium oxide ceramics (with and without yttrium oxide), aluminium oxide ceramics, silicon nitride, silicon nitride ceramics and CFC. If a plurality of inserts are present these need not necessarily be made of the same material.

The insert need not necessarily be electrically conductive.

It is preferable when the insert has a specific thermal conductivity of 1 to 20 W/m*K, more preferably 1 to 12 W/m*K, and in particular 1 to 5 W/m*K. The specific thermal conductivity of the insert is preferably lower than that of the segments.

The insert may further be made of a material which is anisotropic with respect to the specific thermal conductivity. The insert may in particular have a lower specific thermal conductivity in a direction parallel to the longitudinal axis of the electrode than in a direction perpendicular to the longitudinal axis (if the insert is a disc for example this would correspond to the radial direction). For example the specific thermal conductivity of the insert parallel to the longitudinal axis may be between 1 and 20 W/m*K, preferably between 1 and 12 W/m*K, more preferably between 1 and 5 W/m*K. The thermal conductivity perpendicular to the longitudinal axis may be between 1 and 100 W/m*K, preferably between 1 and 60 W/m*K, more preferably between 1 and 20 W/m*K.

It is also conceivable for the insert to be composed of a plurality of elements, for example coaxially joined discs, which differ with respect to their specific thermal conductivity. An insert having a graduated specific thermal conductivity, wherein the specific thermal conductivity can increase from the inside outward, may be produced thereupon.

A further aspect of the invention is a process for producing polysilicon in a reactor comprising at least one filament rod pair heatable by direct passage of current. The process comprises introducing a reaction gas containing a silicon-containing component, in particular trichlorosilane, and hydrogen into the reactor, wherein elemental silicon from the gas phase is deposited at the surface of the rod pair. The process has the feature that the rod pair is held and supplied with current by two electrodes such as are described hereinabove.

The electrode according to the invention is hereinbelow more particularly elucidated with reference to several examples.

FIG. 1A shows the longitudinal section of a prior art electrode 1. The electrode 1 comprises a base segment 14, connected to an electrode holder 11. The electrode holder 11 is generally anchored in a floor plate of a reactor, for example a Siemens reactor. The base segment 14 has essentially a cylindrical shape and has a cylindrical cutout 16 in which a holder segment 12 is accommodated. Base segment 14 and holder segment 12 are fitted one inside the other coaxially with respect to the electrode longitudinal axis $A_L$ and are in mechanical contact with one another via a contact area K. The contact area K (thick line) is formed from the opposing interfaces of the base segment 14 and the holder segment 12, namely from the mantle surface and base surface of the holder segment 12 on the one hand and from the mantle surface and base surface of the cutout 16 on the other hand. The holder segment 12 has a conical tip 13 which is surrounded by a bevelled edge 15 of the base segment 14. The holder segment 12 moreover has a recess 30 for accommodating a filament rod (not shown).

Both the base segment 14 and the holder segment 12 are made of high-purity graphite, wherein the specific thermal conductivity of the holder segment 12 is 40 W/m*K and that of the base segment 14 is 100 W/m*K. The electrode holder is made of an electrically conductive material, for example metal. The electrode is used in particular in the Siemens process for producing polysilicon.

FIG. 1B shows an inventive electrode 10 whose construction generally corresponds to that of electrode 1. For the sake of simplicity elements already known from FIG. 1A have not been relabelled. In contrast to electrode 1, in the inventive electrode 10 the interface (mantle surface) of the holder segment 12 is provided with three circumferential depressions 20. The depressions 20 each have a semicircular cross section. The depressions 20 interrupt the contact area K and thus reduce the size thereof by about 30%. This reduces heat transfer from the holder segment 12 to the base segment 14.

FIG. 1C shows an inventive electrode 10 where depressions 21, 22 have been introduced into the interface of the base segment 14. The mantle surface, forming the interface of the cutout 16 has three circumferential depressions 21. The base surface, forming the interface of the cutout 16 also has three trough-shaped depressions 22. In contrast to the embodiment from FIG. 1B the depressions 22 result in an additional reduction of the contact area K and thus in a lower heat transfer between the two segments 12, 14.

Figure 1D:
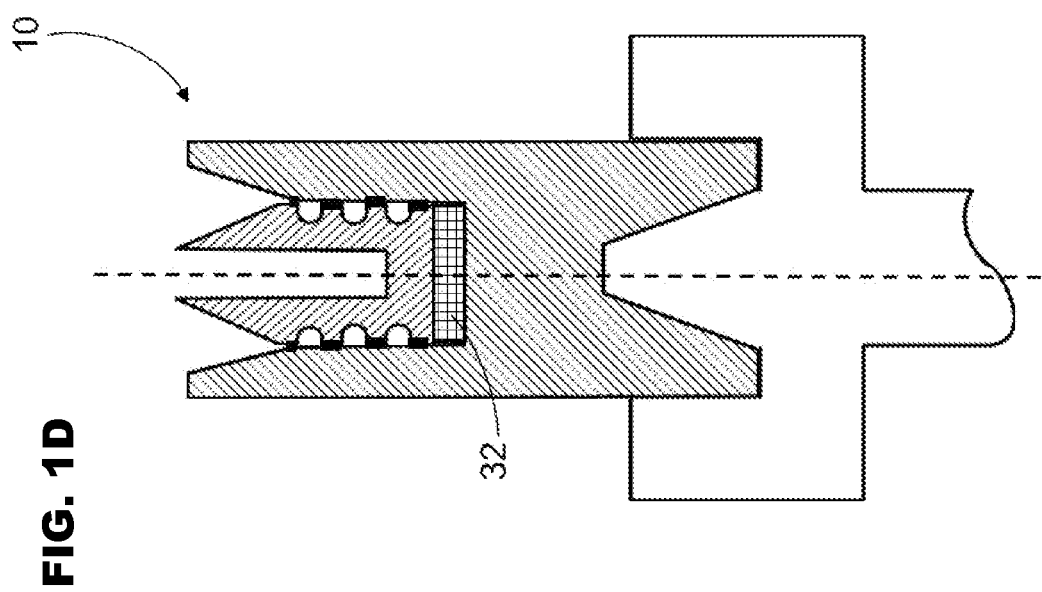

FIG. 1D shows an inventive electrode 10 which corresponds to the electrode 10 of FIG. 1B but with the difference that in addition a disc-shaped insert 32 is arranged between the holder segment 12 and the base segment 14. The contact area K is composed only of the mantle surface of the cutout 16 and the part of the mantle surface of the holder segment 12 not interrupted by the depressions 20. The insert 32 is made of CFC and has a specific thermal conductivity of 10 W/m*K. The insert thus reduces heat transfer between the segments 12, 14 both through a reduction in the contact area K and through its low thermal conductivity.

FIG. 1E shows an inventive electrode 10 which corresponds to the electrode 10 of FIG. 1D but with the difference that an annular insert 33 is arranged between the segments 12, 14. The ratio between the inner diameter and outer diameter of the insert is 0.4 and its specific thermal conductivity is 10 W/m*K.

Figure 1F:
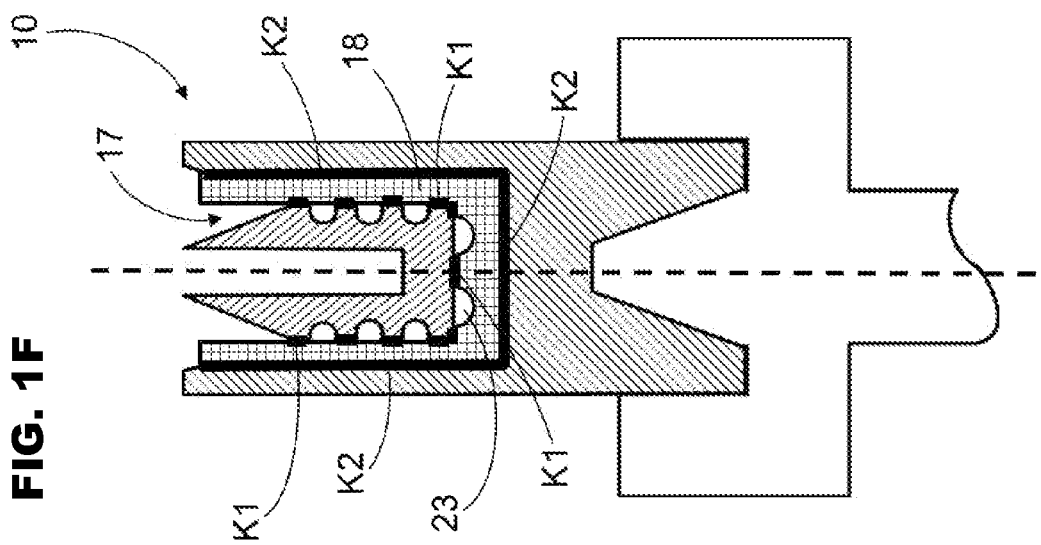

FIG. 1F shows an inventive electrode 10 which further comprises an intermediate segment 18 arranged in the cutout 16 of the base segment 14. The intermediate segment 18 is substantially cylindrical and has a cylindrical cutout 17 in which the holder segment 12 is arranged. The segments 12, 14, 18 are coaxial in respect of the electrode longitudinal axis $A_L$ and are in mechanical contact with one another via a contact area K1 and a contact area K2 (thick lines). The intermediate segment 18 is made of electrical graphite and has a specific thermal conductivity of 70 W/m*K.

The contact area K1 is formed from the opposing interfaces of the holder segment 12 and the intermediate segment 18, namely from the mantle surface and base surface of the holder segment 12 on the one hand and from the mantle surface and base surface of the cutout 17 on the other hand. The contact area K1 is interrupted both by the depressions 20 (cf. FIG. 1B) and by an annular depression 23 in the interface of the intermediate segment 18 and is thus about 50% smaller than a contact area that would result without the presence of the depressions 20, 23.

The contact area K2 (thick line) is formed from the opposing interfaces of the base segment 14 and the intermediate segment 18, namely from the mantle surface and base surface of the intermediate segment 18 on the one hand and from the mantle surface and base surface of the cutout 16 on the other hand.

As a result of the specific thermal conductivity increasing incrementally from the holder segment 12 (40 W/m*K) via the intermediate segment 18 (70 W/m*K) toward the base segment 14 (100 W/m*K) in conjunction with the interrupted contact area K1 the electrode 10 is optimally adapted to an increase in diameter of a polysilicon rod during the Siemens process.

Figure 1G:
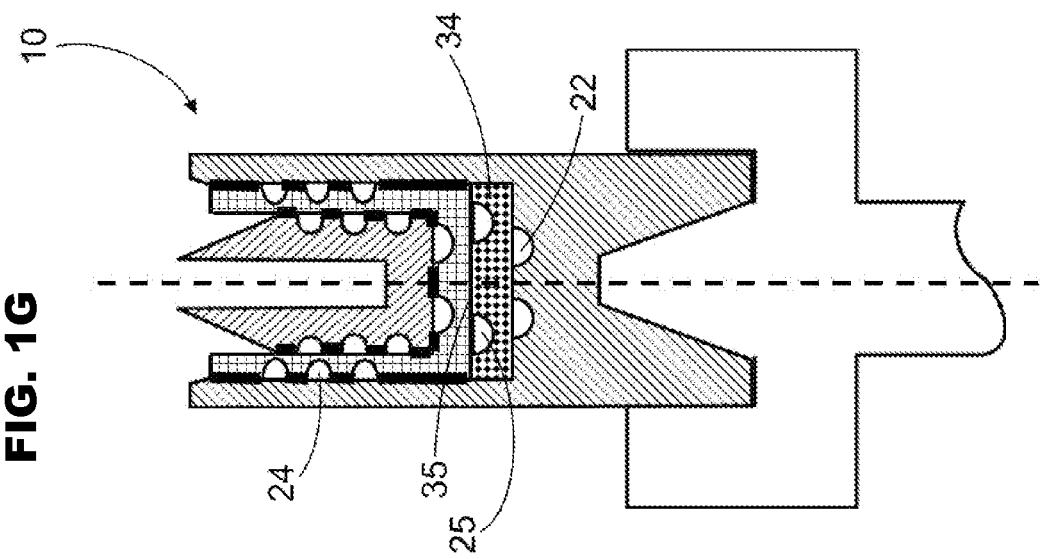

FIG. 1G shows an inventive electrode 10 having both an intermediate segment 18 and an insert 34. The insert 34 is disc-shaped, is arranged between the base segment 14 and the intermediate segment 18 and is manufactured from a zirconium oxide ceramic having a specific thermal conductivity of 3 W/m*K. Said insert has a circular depression 25 on one surface 35.

In contrast to the embodiment of FIG. 1F the intermediate segment 18 additionally has on its mantle surface three circumferential depressions 24 which likewise reduce the contact area K2 similarly to the insert 34.

Due to the presence of the insert 34 and the depressions 24 the thermal conductivity of the electrode 10 in the direction of the base segment 14 is yet further reduced compared to the embodiment of FIG. 1F. The trough-shaped depressions 22 (cf. FIG. 1C) of the base segment 14 contribute to this reduction similarly to the depression 25.

FIGS. 2A to 2F show various embodiments of holder segments 12, wherein the upper figures each show a plan view and the lower figures each show a cross section along the sectional edge labelled S. The holder segment 12 is cylindrical in each case irrespective of depressions present and has a conical tip 13 and a recess 30 for accommodating a filament rod.

The holder segment 12 of FIG. 2A has three depressions 40. Each of the three depressions 40 corresponds to a flank in the form of a segment of a circle that has been removed from the originally cylindrical holder segment 12 (indicated by the dashed line in the above figure).

The holder segment 12 of FIG. 2B corresponds to that of FIG. 1B.

The holder segment 12 of FIG. 2C is a modified form of the embodiment from FIG. 2B. It comprises an areal depression 41 above a circumferential depression 20. This is basically a narrowing which is realizable by turning for example. The dashed line in the upper figure denotes the edge 42 of the depression 41.

The holder segment 12 of FIG. 2D has a depression 44 which follows a helical path around the circumference of the mantle surface 43. The helix is indicated by a dashed line.

The holder segment 12 of FIG. 2E has three depressions 45 running parallel to the electrode axis $A_L$ and having an approximately triangular cross section.

The holder segment 12 of FIG. 2F has four depressions 46 running parallel to the electrode axis $A_L$ and having an approximately semicircular section.

EXAMPLE

In a Siemens reactor as described for example in US 2009/0136408 A1 polysilicon rods having a diameter of about 180 mm were deposited. The electrodes of FIG. 1A (type 1), 1B (type 2), 1D (type 3) and 1F (type 4) were compared with one another with respect to the number of polysilicon rods that fell over during deposition. The bottom ends of the electrodes were positively fitted into a cutout in the top of the electrode holder 11.

The length of the electrode (without holder) was about 115 mm in each case, its diameter about 60 mm. The specific thermal conductivity of the holder segment 12 was 40 W/m*K in each case and that of the base segment 14 was 100 W/m*K in each case. The specific thermal conductivity of the insert 32 of the type 3 electrode was 10 W/m*K and that of the intermediate segment 18 of the type 4 electrode was 70 W/m*K.

The parameters of the deposition process were identical in all experiments. The experiments differed only in the configuration of the electrodes. The deposition temperature during the deposition was on average between 1000° C. and 1100° C. The reaction gas was composed of hydrogen and trichlorosilane.

| Electrode type | Change in fallover rate at thin rod diameter [%] | Change in fallover rate at thick rod diameter [%] | Reduction in contact area K/K1 [%] |
|---|---|---|---|
| 1 (FIG. 1A) | 0 | 0 | 0 |
| 2 (FIG. 1B) | −40 | 0 | 30 |
| 3 (FIG. 1D) | −67 | 0 | 70 |
| 4 (FIG. 1F) | −75 | 0 | 50 |

The change in the fallover rate at thin rod diameter was determined as follows: 500 batches were deposited per electrode type. The batches which fell over at thin rod diameter (D<1.5*electrode diameter, D<90 mm) were counted. Electrode type (FIG. 1A) is the comparative electrode without a reduction in contact area. Here too, the number of batches which fell over at thin diameter from 500 deposited batches was determined. This number was normalized to 100%. The change in the fallover rate U at thin rod diameter for electrode type x (x=2, 3 or 4) based on the number of fallen-over batches with the comparative electrode is calculated as follows:

$$Ux = ((\text{number of fallen-oven batches of type } x/\text{number of fallen-over batches of type 1})-1)*100\%$$

Example:
Number of fallen-over batches of type 2: 12
Number of fallen-over batches of type 1: 20

$$U2 = (12/20-1)*100\% = -40$$

The change in fallover rate at thick rod diameter was determined as follows:

500 batches having a diameter>1.5*electrode diameter, i.e. D>90 mm, were deposited with each electrode type. Batches which failed or fell over at a diameter of <1.5*electrode diameter were not counted. Of the 500 batches for each electrode type only the batches which fell over at thick diameter were counted. The change in the fallover rate was calculated by the same scheme as shown above.

Determination of the contact area was carried out by the following method: calculation of the contact area by reference to the dimensions in the manufacturing drawings for the electrodes. This is related to an assumed contact area of the component parts of the electrode without depressions/elevations, i.e. without a reduction in the contact area.

$$\text{Reduction in contact area } K = (\text{contact area with reduction/contact area without reduction}-1)*100\%$$

The invention claimed is:

1. An electrode assembly, comprising a plurality of segments, these segments comprising a holder segment, a base segment having a cutout in which the holder segment is accommodated, and optionally one or more intermediate segment(s) arranged between the cutout of the base segment and the holder segment, wherein at least two of the segments differ with respect to their specific thermal conductivity, the holder segment having the lowest specific thermal conductivity and the base segment having a higher specific thermal conductivity, and wherein at least two segments which are adjacent one another have opposing interfaces which are at least partially in mechanical contact with one another and thus form a contact surface, wherein the area of the contact surface is reduced by configuring a surface of one or both of said adjacent segments to have at least one depression and/or elevation, and wherein at one or more insert(s) is/are arranged at a bottom of a cutout in one segment which accommodates an inner segment.

2. The electrode assembly of claim 1, wherein the interface of the holder segment has at least one depression and/or elevation.

3. The electrode assembly of claim 1, wherein the holder segment has a recess for accommodating a filament rod.

4. The electrode assembly of claim 1, wherein the depressions and/or elevations are punctate and/or linear.

5. The electrode assembly of claim 1, wherein the segments are made of graphite.

6. The electrode assembly of claim 1, wherein at least one insert of the one or more insert(s) has at least one surface having at least one depression and/or elevation.

7. The electrode assembly of claim 1, wherein at least one insert of the one or more insert(s) is made of a low thermal conductivity material different from the segments.

8. The electrode assembly of claim 1, wherein the one or more insert(s) is/are made of a material selected from the group comprising quartz, silicon carbide, silicon nitride, silicon nitride ceramics, zirconium oxide ceramics, aluminium oxide ceramics, carbon fibre-reinforced carbon, and mixtures thereof.

9. The electrode assembly of claim 1, wherein at least one insert of the one or more insert(s) has a specific thermal conductivity of 1 to 20 W/m*K.

10. The electrode assembly of claim 1, wherein at least one insert of the one or more insert(s) has a specific thermal conductivity of 1 to 5 W/m*K.

11. The electrode assembly of claim 1, wherein at least one insert of the one or more insert(s) is made of a material which is anisotropic with respect to its specific thermal conductivity.

12. A process for producing polycrystalline silicon in a reactor comprising at least one filament rod pair heatable by direct passage of current, comprising introducing a reaction gas containing a silicon-containing component and hydrogen into the reactor, wherein elemental silicon is deposited from the gas phase onto a surface of the at least one filament rod pair, wherein the filament rod pair is held and supplied with current by two assemblies of claim 1.

13. The electrode assembly of claim 1, having an inner holder segment adjoining and at least partially within the cutout of the base section, and which has no intermediate sections.

14. The electrode assembly of claim 1, having an inner holder segment adjoining and at least partially within a cutout of a single intermediate segment adjoining and at least partially within the cutout of the base segment.

15. The electrode assembly of claim 1, where the area of the contact surface of the holder segment and an adjoining intermediate segment or adjoining base segment is reduced by 30-90% due to the presence of the at least one depression or elevation of the holder segments and/or adjoining segments.

16. The electrode assembly of claim 1, where the area of the contact surface of the holder segment and an adjoining intermediate segment or adjoining base segment is reduced by 60-90% due to the presence of the at least one depression or elevation of the holder segments and/or adjoining segments.

17. The electrode assembly of claim 1, wherein each segment comprises highest purity graphite which is characterized by a cold ashing residue of less than 10 ppm.

18. The electrode assembly of claim 1, wherein said depressions consist of annular grooves in an outside surface of an inner segment and/or in an inside surface of a cutout in an outer segment.

19. The electrode assembly of claim 1, wherein the insert is in the form of a flat triangle, square, polygon, disk, or ring, each optionally containing perforations, and is located below the holder segment in a cutout in an intermediate segment or in the base segment.

* * * * *